United States Patent
Chen et al.

(10) Patent No.: US 8,305,140 B1
(45) Date of Patent: Nov. 6, 2012

(54) LINEAR, LARGE SWING ACTIVE RESISTIVE CIRCUIT AND METHOD

(75) Inventors: Du Chen, San Jose, CA (US); Kemal S. Demirci, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/199,693

(22) Filed: Sep. 7, 2011

(51) Int. Cl.
*H03F 3/68* (2006.01)

(52) U.S. Cl. .............................. 330/85; 330/98; 330/260

(58) Field of Classification Search .................. 330/85, 330/98, 260
See application file for complete search history.

(56) References Cited

U.S. PATENT DOCUMENTS

| | | | | |
|---|---|---|---|---|
| 3,058,068 | A * | 10/1962 | Hinrichs et al. | 330/10 |
| 3,353,032 | A * | 11/1967 | Morgan et al. | 327/441 |
| 3,355,671 | A * | 11/1967 | Brewster | 330/260 |
| 3,943,367 | A * | 3/1976 | Baker | 250/551 |
| 6,084,232 | A * | 7/2000 | Kimura | 250/214 A |
| 7,683,710 | B2 * | 3/2010 | Arnold | 330/103 |

OTHER PUBLICATIONS

"Linear transconductor with rail-to-rail input swing for very large time constant applications" by F. Gozzini et al., Electronics Letters, Sep. 14, 2006, vol. 42, No. 19, 2 pages.

"Transimpedance Amplifier for High Sensitivity Current Measurements on Nanodevices" by Giorgio Ferrari et al., IEEE Journal of Solid-State Circuits, vol. 44, No. 5, May 2009, pp. 1609-1616.

"Low-Noise Single-Chip Potentiostat for Nano-Bio-Electrochemistry over a 1MHz Bandwidth" by Marco Carminati et al., IEEE 2009, pp. 952-955.

"Fully Integrated Charge Sensitive Amplifier for Readout of Micromechanical Capacitive Sensors" by Mikko Saukoski et al., IEEE 2005, pp. 5377-5380.

"A Low-Power Low-Noise CMOS Amplifier for Neural Recording Applications" by Reid R. Harrison et al., IEEE Journal of Solid-State Circuits, vol. 38, No. 6, Jun. 2003, pp. 958-965.

* cited by examiner

*Primary Examiner* — Patricia Nguyen
(74) *Attorney, Agent, or Firm* — John J. Patti; Wade J. Brady, III; Frederick J. Telecky, Jr.

(57) ABSTRACT

Active resistive circuitry (10, 10A, 11, 11A 25, 30, 35, or 40) includes a first current divider circuit (11) having an input (15) coupled to a first signal ($V_i$). The first current divider circuit (11) includes a first amplifier (13) having a first input (−) coupled to the first signal ($V_i$). A symmetrically bilateral first bidirectional circuit (M1a,M1b; R1) is coupled between the first input (−) of the first amplifier (13) and an output (17) of the first amplifier (13), and functions as a feedback circuit of the first amplifier (13). A symmetrically bilateral second bidirectional circuit (M2a,M2b; R2) is coupled between the output (17) of the first amplifier (13) and an output (18) of the first current divider circuit (11).

24 Claims, 8 Drawing Sheets

LINEAR, LARGE SWING ACTIVE RESISTIVE CIRCUIT AND METHOD

BACKGROUND OF THE INVENTION

The present invention relates generally to active resistive circuits, including active resistor circuits and current amplifier or multiplier circuits, and current divider circuits, and more particularly to active resistive circuits that can achieve high resistance using small size MOS transistors and also can achieve a high degree of linearity when a large range of voltages are applied to such active resistive circuits.

Ordinary passive resistors are used for many circuit applications that require very high resistances. However, known passive resistors have the disadvantage that they require undesirably large amounts of integrated circuit chip area. In some applications, known active resistor structures, such as long-channel diode-connected field effect transistors are used as high resistance resistors, but such devices have the disadvantages of undesirably low linearity and undesirably limited ranges of voltage that can be applied across such active resistor structures.

Figure 1:
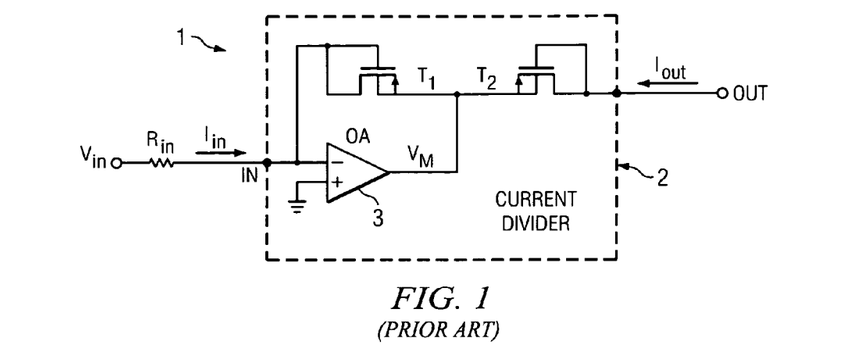
FIG. 1 is a schematic diagram of a prior art active resistor.

FIG. 1 shows an active current divider circuit 1 which includes a passive resistor $R_{in}$ and a current divider 2. An input voltage $V_{in}$ causes an input current $I_{in}$ to flow into a conductor that is connected to the (−) input of an operational amplifier 3 and to the gate and drain of a P-channel transistor T1. The (+) input of operational amplifier 3 is connected to ground. The output $V_M$ of operational amplifier 3 is connected to the source of transistor T1 and to the source of a P-channel transistor T2, the gate and drain of which are connected to an output terminal OUT. An output current $I_{out}$ flows through the output conductor into the drain of transistor T2. Active current divider circuit 1 is described in detail in the article "Linear Transconductor with Rail-To-Rail Input Swing for Very Large Time Constant Applications" by Gozzini et al., Electronics Letters, Sep. 14, 2006, Vol. 42, No. 19.

Figure 2:
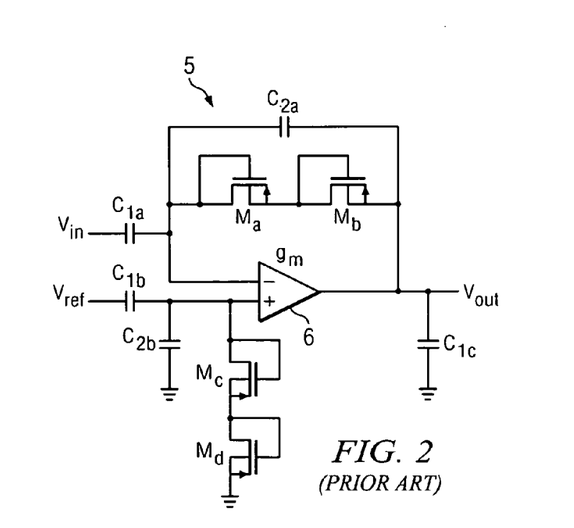
FIG. 2 is a schematic diagram of a prior art low-noise CMOS amplifier utilizing MOS-bipolar pseudo-resistors.

FIG. 2 shows a neural amplifier 5 that uses a MOS-bipolar pseudo-resistor element. Neural amplifier 5 includes a transconductance amplifier 6 which has its (−) input coupled to one terminal of an input capacitor C1a, to one terminal of a feedback capacitor C2a, and to the gate and drain of a P-channel transistor Ma. The other terminal of input capacitor C1a is coupled to $V_{in}$. The source of transistor Ma is connected to the gate and drain of a P-channel transistor Mb, the source of which is connected to the other terminal of feedback capacitor C2a, the output $V_{out}$ of amplifier 6, and one terminal of an output capacitor C1c. The (+) input of transconductance amplifier 6 is connected to one terminal of another input capacitor C1b, the other terminal of which is coupled to $V_{ref}$. The (+) input of transconductance amplifier 6 also is connected to one terminal of a capacitor C2b and to the gate and drain of a P-channel transistor Mc. The source of transistor Mc is connected to the gate and drain of a P-channel transistor Md. The other terminal of output capacitor C1c and the other terminal of capacitor C2b are connected to ground. The source of transistor Md is connected to ground. This circuit is shown in FIG. 1 of the article "A Low-Power Low-Noise CMOS Amplifier for Neural Recording Applications" by Harrison et al., IEEE Journal of Solid-State Circuits, Vol. 38, No. 6, June, 2003.

Figure 3:
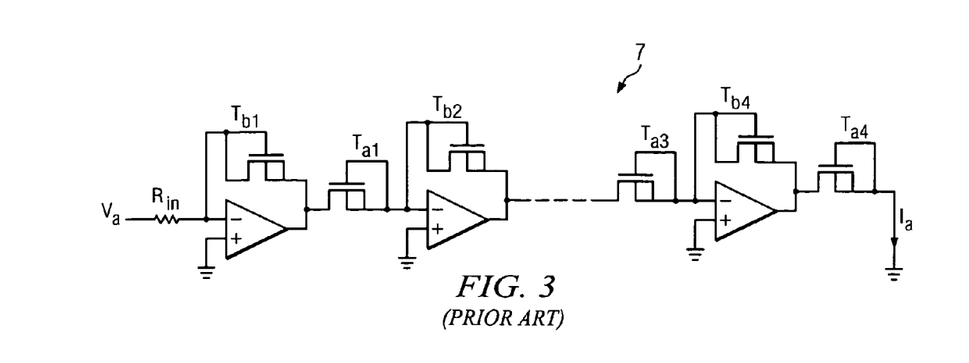
FIG. 3 is a schematic diagram of another prior art active resistor.

FIG. 3 shows a high resistance active resistor 7 circuit in which an input resistor $R_{in}$ is coupled between an input voltage Va and the (−) input of an operational amplifier, the (+) input of which is connected to ground. The (−) input of the operational amplifier is connected to the gate and drain of a transistor Tb1, the source of which is connected to the output of the operational amplifier and the source of a transistor Ta1, the gate and drain of which are connected to the gate and drain of which are connected an output of a first current divider circuit formed by $R_{in}$, transistors Tb1 and Ta1, and the operational amplifier. The output of the first current divider circuit is connected to the input of a similar second current divider circuit, the output of which is connected to the input of a similar third current divider circuit, and so forth. The last current divider circuit in the sequence conducts its output current Ia to ground. Active resistor circuit 7 is included as a large-resistance active resistor circuit shown in FIG. 3 of "Transimpedance Amplifier for High Sensitivity Current Measurements on Nano Devices" by Ferrari et al., IEEE Journal of Solid-State Circuits, Vol. 44, No. May, 2009.

For present state-of-the-art CMOS processes, well-defined high resistance values can be implemented by means of passive resistors or active circuits, but passive resistors consume large amounts of die area, which increases cost. Furthermore, such high resistance values cannot be controlled as precisely as would be desirable. Most of the known active resistors consume less integrated circuit chip area than conventional passive integrated circuit resistors but have undesirably poor linearity, undesirably low applied operating voltage ranges, and undesirable temperature-dependent and process-dependent characteristics. For example, since the output current $I_{out}$ in FIG. 1 flows in the direction opposite to that of input current $I_{in}$, active resistor circuit 1 has negative resistance.

Furthermore, active resistor circuit 1 is not symmetrically bilateral, meaning that its resistance is much different if the input current direction is reversed, because the operating region of transistors T1, T2 is different for positive and negative values of input voltage Vin. When Vin is positive, the drain-well PN junctions of transistors T1 and T2 are forward biased and conduct the transistor currents. When Vin is negative, transistors T1 and T2 are in their subthreshold operating regions, and their currents are conducted through the source-drain channels of transistors T1 and T2. Similarly, the resistances of the pseudo-resistor elements used in circuit 5 of FIG. 2 show large voltage dependency, i.e., high non-linearity, since there is an exponential relation between the current and voltage of these pseudo-resistor elements, independent of the transistor operating regions. In addition, the resistances of these pseudo-resistors exhibit substantially process-dependent characteristics. The known active resistor circuit 7 shown in FIG. 3, solves the negative resistance problem of the active resistor circuit shown in FIG. 1 if an even number of stages are cascaded. However, similarly to active resistor 1 in FIG. 1, active resistor 7 in FIG. 3 is not symmetrically bilateral.

Although high resistance and suitable linearity may be obtained with off-chip resistors, this usually results in increased cost and system complexity. Also, use of off-chip resistors adds increased parasitic elements that may substantially degrade circuit performance when an off-chip resistor is connected to a high-impedance circuit node, such as a virtual ground level generated by an operational amplifier.

Current divider circuitry similar to that disclosed in the above mentioned references has been used to provide amplification of very small currents, as disclosed in "Low-Noise Single-Chip Potentiostat for Nano-Bio-Electrochemistry over A 1 MHZ Bandwidth" by Carminati et al., 16th IEEE International Conference on Electronics, Circuits, and Systems, 13-16 Dec. 2009. The potentiostat circuits shown in FIG. 1 and FIG. 2 of this reference are bilateral, but they are not "symmetrically bilateral". (Bilateral operation is obtained with the addition of parallel connection of N-channel MOSFET transistors in parallel with P-channel MOSFET transistors, so that either a P-channel MOSFET or a N-channel MOSFET transistor conducts current, depending on the current direction).

There is an unmet need for an active resistive circuit and method which allow large input signal swings across the active resistor and which also provide substantially improved linearity of the active resistor characteristics and also show less dependency on process and temperature variations compared to prior active resistive circuits.

There also is an unmet need for an active resistive circuit and method which provide an active resistor having symmetrically bilateral transfer characteristics.

There also is an unmet need for a high-resistance active resistive circuit and method which requires less integrated circuit chip area than prior high resistance active resistor circuits.

SUMMARY OF THE INVENTION

It is an object of the invention to provide an active resistive circuit and method which allow large input signal swings across the active resistor and which also provide substantially improved linearity of the active resistor characteristics compared to prior active resistor circuits.

It is another object of the invention to provide a high-resistance active resistive circuit and method which requires less integrated circuit chip area than prior high resistance passive resistive circuits.

It is another object of the invention to provide an active resistive circuit having symmetrically bilateral transfer characteristics.

It is another object of the invention to provide a current amplifier or multiplier and method for detecting very small current levels such as leakage current.

It is another object of the invention to provide a current divider and method that are useful for very small current levels.

It is another object of the invention to provide a number of circuits that are improved by use of the high-resistance active resistive circuits of the present invention.

Briefly described, and in accordance with one embodiment, the present invention provides active resistive circuitry (10, 10A, 11, 11A, 25, 30, 35, or 40) which includes a first current divider circuit (11) having an input (15) coupled to a first signal ($V_i$). The first current divider circuit (11) includes a first amplifier (13) having a first input (−) coupled to the first signal ($V_i$). A symmetrically bilateral first bidirectional circuit (M1a,M1b; R1) is coupled between the first input (−) of the first amplifier (13) and an output (17) of the first amplifier (13), and functions as a feedback circuit of the first amplifier (13). A symmetrically bilateral second bidirectional circuit (M2a,M2b; R2) is coupled between the output (17) of the first amplifier (13) and an output (18) of the first current divider circuit (11).

In one embodiment, the active resistor circuitry includes a passive resistor (R) having a first terminal (9) coupled to the first signal ($V_i$) and a second terminal (15) coupled to the first input (−) of the first amplifier (13). In one embodiment, the first bidirectional circuit (M1a,M1b; R1) includes a first transistor (M1a) having a source coupled to the first input (−) of the first amplifier (13) and a gate and drain coupled to the output (17) of the first amplifier (13). The first bidirectional circuit (M1a,M1b) also includes a second transistor (M1b) having a source coupled to the output (17) of the first amplifier (13) and a gate and drain coupled to the (−) input of the first amplifier (13). The second bidirectional circuit (M2a, M2b) includes a third transistor (M2a) having a source coupled to the output (17) of the first amplifier (13) and a gate and drain coupled to the first input (−) of the first amplifier (13). The second bidirectional circuit (M2a,M2b) also includes a fourth transistor (M2b) having a source coupled to the output (18) of the first current divider circuit (11) and a gate and drain coupled to the output (17) of the first amplifier (13).

In one embodiment, the first bidirectional circuit (M1a, M1b, R1) includes a first resistor (R1) having one terminal coupled to the first input (−) of the first amplifier (13) and another terminal coupled to the output (17) of the first amplifier (13). The second bidirectional circuit (R2) includes a second resistor (R2) having one terminal coupled to the output (17) of the first amplifier (13) and another terminal coupled to the first input (−) of the first amplifier (13).

In one embodiment, the active resistive circuitry (10, 10A, 11, or 11A) includes a second current divider circuit (12) having an input (18) coupled to the output (18) of the first current divider circuit (11). The second current divider circuit (12) includes a second amplifier (19) having a first input (−) coupled to the output (18) of the first current divider circuit (11). A third bidirectional circuit (M3a,M3b; R3) is coupled between the first input (−) of the second amplifier (19) and an output (20) of the second amplifier (19) and functioning as a feedback circuit of the second amplifier (19), and a fourth bidirectional circuit (M4a,M4b; R4) is coupled between the output (20) of the second amplifier (19) and an output (22) of the second current divider circuit (12).

In one embodiment, the first bidirectional circuit (M1a, M1b) includes a first transistor (M1a) having a source coupled to the first input (−) of the first amplifier (13) and a gate and drain coupled to the output (17) of the first amplifier (13). The first bidirectional circuit (M1a,M1b) includes a second transistor (M1b) having a source coupled to the output (17) of the first amplifier (13) and a gate and drain coupled to the first input (−) of the first amplifier (13). The second bidirectional circuit (M2a,M2b) includes a third transistor (M2a) having a source coupled to the output (17) of the first amplifier (13) and a gate and drain coupled to the input (18) of the second current divider circuit (12). The second bidirectional circuit (M2a,M2b) also includes a fourth transistor (M2b) having a source coupled to the input (18) of the second current divider circuit (12) and a gate and drain coupled to the output (17) of the first amplifier (13). The third bidirectional circuit (M3a,M3b) includes a fifth transistor (M3a) having a source coupled to the first input (−) of the second amplifier (19) and a gate and drain coupled to the first input (−) of the second amplifier (19). The third bidirectional circuit (M3a,M3b) also includes a sixth transistor (M3b) having a source coupled to the output (20) of the second amplifier (19) and a gate and drain coupled to the first input (−) of the second amplifier (19). The fourth bidirectional circuit (M4a,M4b) includes a seventh transistor (M4a) having a source coupled to the output (20) of the second amplifier (19) and a gate and drain coupled to the output (22) of the second current divider circuit (12). The fourth bidirectional circuit (M4a,M4b) also includes an eighth transistor (M4b) having a source coupled to the output (22) of the second current divider circuit (12) and a gate and drain coupled to the output (20) of the second amplifier (19).

In one embodiment, a channel-width-to-channel-length ratio of the first transistor (M1a) divided by a channel-width-to-channel-length ratio of the third transistor (M2a) is substantially greater than a channel-width-to-channel-length ratio of the fifth transistor (M3a) divided by a channel-width-to-channel-length ratio of the seventh transistor (M4a). A channel-width-to-channel-length ratio of the second transistor (M1b) divided by a channel-width-to-channel-length ratio of the fourth transistor (M2b) is substantially greater than a channel-width-to-channel-length ratio of the sixth transistor (M3b) divided by a channel-width-to-channel-length ratio of the eighth transistor (M4b). In one embodiment, the transistors are N-channel transistors.

In one embodiment, the first bidirectional circuit (R1) includes a first resistor (R1) having one terminal coupled to the first input (−) of the first amplifier (13) and another terminal coupled to the output (17) of the first amplifier (13). The second bidirectional circuit (R2) includes a second resistor (R2) having one terminal coupled to the output (17) of the first amplifier (13) and another terminal coupled to the first input (−) of the first amplifier (13). The third bidirectional circuit (R3) includes a third resistor (R3) having one terminal coupled to the first input (−) of the second amplifier (19) and another terminal coupled to the output (20) of the second amplifier (19). The fourth bidirectional circuit (R4) includes a fourth resistor (R4) having one terminal coupled to the output (20) of the second amplifier (19) and another terminal coupled to the output (22) of the second current divider circuit (12A).

In one embodiment, a resistance of the first resistor (R1) divided by a resistance of the second transistor (R2) is substantially greater than a resistance of the third resistor (R3) divided by a resistance of the fourth resistor (R4).

In one embodiment, the active resistive circuitry (25 in FIG. 5) includes an inverting amplifier (25) which includes a main amplifier (28) and an input resistor (R1) having a first terminal coupled to receive an input signal (27). The active resistive circuit (10) includes the first amplifier (13), and the first (11) and second (12) current divider circuits. The output (22) of the second current divider circuit (12) is coupled to a second terminal (22A) of the input resistor (R1) and an input (−) of the main amplifier (28). An output (29) of the main amplifier (28) is coupled to the first terminal (9) of the passive resistor (R).

In one embodiment, the active resistive circuitry (30 in FIG. 6) includes a transimpedance amplifier (30) including a main amplifier (31) having an input (−) coupled to receive an input signal (22). The active resistive circuit (10) also includes the first amplifier (13) and the first (11) and second (12) current divider circuits. The output (22) of the second current divider circuit (12) is coupled to the input (−) of the main amplifier (31), and an output (33) of the main amplifier (28) is coupled to the first terminal (9) of the passive resistor (R).

In one embodiment, the active resistive circuitry (35 in FIG. 7) includes a band-pass filter (35) including a main amplifier (36) and an input resistor (R1) having a first terminal (27) coupled to a first terminal of an input capacitor (C1). The input capacitor (C1) has a second terminal coupled to receive an input signal (37). The active resistive circuit (10) includes the first amplifier (13) and the first (11) and second (12) current divider circuits. The output (22) of the second current divider circuit (12) is coupled to a second terminal (22A) of the input resistor (R1) and an input (−) of the main amplifier (36), and an output (38) of the main amplifier (36) is coupled to the first terminal (9) of the passive resistor (R). A feedback capacitor (C2) is coupled in parallel with the active resistive circuit (10).

In one embodiment, the active resistive circuitry (40 in FIG. 8) includes a charge sensitive amplifier (40) including a main amplifier (41) and an input capacitor (C1A) having a first terminal coupled to receive an input signal. The active resistive circuit (10A) includes the first amplifier (13), and the first (11) and second (12) current divider circuits. The output (22A) of the second current divider circuit (12) is coupled to a second terminal (22A) of the input capacitor (C1A) and an input (−) of the main amplifier (41). An output (43A) of the main amplifier (41) is coupled to the first terminal (9A) of the passive resistor (R). A feedback capacitor (C2A) is coupled in parallel with the active resistive circuit (10A). Each of the first (13) and second (19) amplifiers has a second input (+) coupled to a reference voltage ($V_{ref}$), and the output (22) of the second current divider circuit (12) is regulated to the reference voltage ($V_{ref}$).

In one embodiment, the invention includes a method for providing active resistor circuitry (10, 10A, 11, 11A 25, 30, 35, or 40), the method including coupling a first signal ($V_i$) to an input (−) of a first amplifier (13); coupling a symmetrically bilateral first bidirectional circuit (M1a,M1b; R1) of a first current divider circuit (11) between the input (−) of the first amplifier (13) and an output (17) of the first amplifier (13); and coupling a symmetrically bilateral second bidirectional circuit (M2a,M2b; R2) of the first current divider circuit (11) between the output (17) of the first amplifier (13) and an output (18) of the first current divider circuit (11).

In one embodiment, the method includes coupling a first terminal (9) of a passive resistor (R) to a first signal (V) and coupling a second terminal (15) of the passive resistor (R) to the input (−) of the first amplifier (13). In one embodiment, the first bidirectional circuit (M1a,M1b) includes a first transistor (M1a) and a second transistor (M1b), and the method includes coupling a source of the first transistor (M1a) to the input (−) of the first amplifier (13), coupling a gate and drain of the first transistor (M1a) to the output (17) of the first amplifier (13), coupling a gate and drain of the second transistor (M1b) to the input (−) of the first amplifier (13), and coupling a source of the second transistor (M1b) to the output (17) of the first amplifier (13).

In one embodiment, the first bidirectional circuit (R1) includes a first resistor (R1) and the second bidirectional circuit (R2) includes a second resistor (R2), and the method includes coupling one terminal of the first resistor (R1) to the input (−) of the first amplifier (13), coupling another terminal of the first resistor (R1) to the output (17) of the first amplifier (13), coupling one terminal of the second resistor (R2) to the output (17) of the first amplifier (13), and coupling another terminal of the second resistor (R2) to the output (18) of the first current divider circuit (11).

In one embodiment, the method includes providing a second current divider circuit (12) having an input (18) coupled to the output (18) of the first current divider circuit (11), the second current divider circuit (12) including a second amplifier (19) having an input (−) coupled to the output (18) of the first current divider circuit (11), a third bidirectional circuit (M3a,M3b; R3) coupled between the input (−) of the second amplifier (19) and an output (20) of the second amplifier (19) and functioning as a feedback circuit of the second amplifier (19), and a fourth bidirectional circuit (M4a,M4b; R4) coupled between the output (20) of the second amplifier (19) and an output (22) of the second current divider circuit (12).

In one embodiment, the method includes providing a channel-width-to-channel-length ratio of the first transistor (M1a) divided by a channel-width-to-channel-length ratio of the third transistor (M2a) which is substantially greater than a channel-width-to-channel-length ratio of the fifth transistor (M3a) divided by a channel-width-to-channel-length ratio of the seventh transistor (M4a).

In one embodiment, the invention provides a circuit for providing an active resistance ($R_{EFF}$), including means (9) for coupling a first signal ($V_i$) to an input (−) of a first amplifier (13); symmetrically bilateral first bidirectional means (M1a, M1b; R1) of a first current divider circuit (11) coupled between the input (−) of the first amplifier (13) and an output of the first amplifier (13); and symmetrically bilateral second bidirectional means (M2a,M2b; R2) of the first current divider circuit (11) coupled between the output of the first amplifier (13) and an output of the first current divider circuit (11).

DETAILED DESCRIPTION OF THE PREFERRED EMBODIMENTS

The invention provides a two-port resistive circuit structure which may be used as an active resistor circuit or as a current amplifier/multiplier, or current divider. The resistive circuit structure uses current division to generate a very low output current from the input current. The low output current is proportional to the applied input voltage. A very high, linear, symmetrically bilateral effective resistance $R_{EFF}$ is thereby obtained.

Figure 4A:
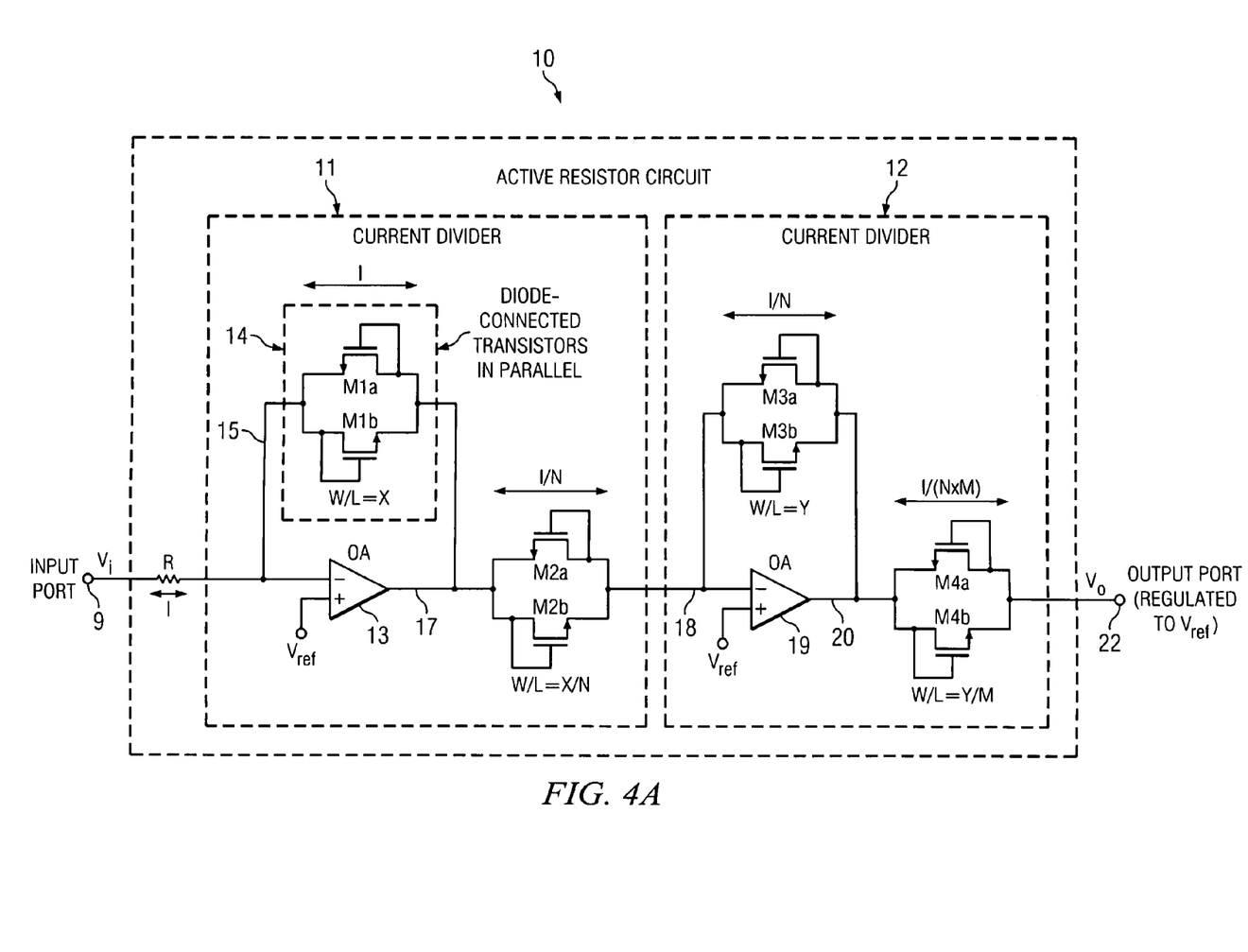
FIG. 4A is a schematic diagram of an active resistor of one embodiment of the present invention.

FIG. 4A is a schematic diagram of an active resistor circuit 10 which includes a passive input resistor R coupled between an input of a first current divider circuit 11 and an input voltage V, on conductor 9. Current divider 11 includes an operational amplifier 13 having its (−) input coupled by conductor 15 to one terminal of input resistor R and a pair 14 of diode-connected N-channel transistors M1a and M1b. Specifically, conductor 15 is connected to the source of transistor M1a and the gate and drain of transistor M1b. The (+) input of amplifier 13 is coupled to a suitable reference voltage $V_{ref}$. The output of amplifier 13 is connected by conductor 17 to the source of transistor M1b and the gate and drain of transistor M1a and also to the source of a N-channel transistor M2a and the gate and drain of a N-channel transistor M2b.

The source of transistor M2b and the gate and drain of transistor M2a are connected by conductor 18 to an input of a second current divider circuit 12. Current divider circuit 12 includes an operational amplifier 19 which has its (−) input connected by conductor 18 to the output of current divider circuit 11 and also to the source of diode-connected N-channel transistor M3a and the gate and drain of diode-connected N-channel transistor M3b. The (+) input of operational amplifier 19 is connected to $V_{ref}$. The output of operational amplifier 19 is connected by conductor 20 to the source of transistor M3b, the gate and drain of transistor M3a, the source of a diode-connected N-channel transistor M4a and the gate and drain of a diode-connected N-channel transistor M4b. The source of transistor M4b and the gate and drain of transistor M4a are connected by conductor 22 to the output of current divider circuit 12, which also is the output of active resistor circuit 10. An output voltage $V_o$ that is regulated to be equal to $V_{ref}$ is produced on conductor 22.

The channel-width-to-channel-length ratio (W/L) of each of transistors M1a and M1b is equal to X, and the W/L of each of transistors M2a and M2b is equal to X/N. The W/L of each of transistors M3a and M3b is equal to Y, and the W/L of each of transistors M4a and M4b is equal to Y/N.

Thus, active resistor circuit 10 in FIG. 4A includes two current divider circuits 11 and 12 and one relatively low-resistance passive resistor R. Passive resistor R converts input voltage Vi into input current I. Since the voltage on conductor 15 is regulated to be equal to the virtual ground potential $V_{ref}$ by operational amplifier 13, an advantage of active resistor circuit 10 is that its input voltage Vi does not affect the operation of the rest of the circuit. (This is also an advantage of Prior Art FIG. 1.) Active resistor circuit 10 is able to handle large voltage swings at input port 9 without substantial degradation of the linearity of its effective resistance $R_{EFF}$. (The maximum voltage that can be applied to active resistor circuit 10 depends on the capability of the process by means of which the circuit has been fabricated).

In operation, the input current I, which is equal to (Vi−$V_{ref}$)/R, flows through current divider circuits 11 and 12 in FIG. 4A and is divided by the division ratio M of current divider circuit 11 and the division ratio N of current divider circuit 12. Each of current divider circuits 11 and 12 is composed of one operational amplifier and four MOSFETs (which may be either P-channel or N-channel MOSFETs). To allow symmetric, bidirectional current flow (i.e., bipolar operation) in current divider circuits 11 and 12, the two diode-connected transistors (e.g. M1a and M1b) are connected in parallel, and only one of those transistors conducts current, depending on whether input voltage $V_i$ is greater than or less than $V_{ref}$. The pairs of parallel-connected, diode-connected transistors M1a,M1b and M2a,M2b provide bidirectional currents and balanced or bilateral active resistances in both directions, in contrast to the prior art. Use of the second current divider circuit (or use of any even number of current divider circuits) causes the effective active resistance of the active current resistor circuit to be positive.

During operation of current divider circuit 11, the current through transistor M1a (or M1b) changes the output voltage of operational amplifier 13. This change in the output voltage of operational amplifier 13 causes an equal amount of change in the gate-to-source voltage of transistor M1a (or M1b) and M2a (or M2b) because the voltages of conductor 15 (or 18) are caused to be equal to $V_{ref}$ by the feedback operation of operational amplifier 13 (or 19). Different amounts of change occur in the currents through transistors M1a (or M1b) and M2a (or M2b), respectively, because of their above described different W/L ratios. The current flowing through transistor M2a (or M2a) is equal to the current flowing through transistor M1a (or M1b) divided by the division ratio N, which is equal to the W/L ratio of transistor M1a (or M1b) divided by the W/L ratio of transistor M2a (or M2b). Note that since conductor 18 is regulated to be equal to $V_{ref}$, the gate-to-source voltage VGS of transistor M2a (or M2b) is equal to the VGS of transistor M1a (or M1b). All of the excess current flowing into conductor 17 from transistor M1a that does not flow into transistor M2a is absorbed by the output of operational amplifier 13. (Similarly, all of the excess current flowing from conductor 17 into transistor M1b that does not flow into conductor 17 from transistor M2b is supplied by the output of operational amplifier 13).

If, for example, the W/L (i.e., size) of transistor M1a is larger than that of transistor M2a, in other words, if N is larger than 1, current divider circuit 11 divides the input current I by the division ratio N. Similarly, current divider circuit 12 divides its input current, which is equal to I/N, by the division ratio M, where M is equal to the W/L ratio of transistor M3a (or M3b) divided by the W/L ratio of transistor M4a (or M4b).

Operation is essentially the same in current divider circuit 12. Note that it is necessary that the output conductor 22 be regulated to $V_{ref}$. This is usually accomplished by means of an application circuit that contains active resistive circuit 10. For example, in subsequently described FIG. 5, operational amplifier 28 regulates the voltage on conductor 22 to $V_{ref}$.

To summarize, input voltage Vi is converted to input current I, which is divided by current divider circuits 11 and 12, which have division ratios of M and N, respectively. Therefore, the output current of active resistor circuit 10 is equal to I/(N×M). As long as the voltage $V_o$ on output conductor 22 is regulated to equal $V_{ref}$, the effective resistance $R_{EFF}$ between input conductor 9 and output conductor 22 of active resistor circuit 10 is the ratio of input voltage Vi to the current I/(N×M) in output conductor 22. That is, $R_{EFF}$=M×N×R.

Note that passive resistor R may be replaced by a current source or another kind of active resistor. If passive resistor R is replaced by a current source, active resistor circuit 10 becomes a current amplifier or a current divider. If passive resistor R is replaced by another active resistor, active resistor circuit 10 in FIG. 4A has the general configuration of the active resistor circuit shown in Prior Art FIG. 3, but it might not be symmetrically bilateral.

Also note that if the W/L of M2a and M2b is larger than the W/L of M1a and M1b, the output of amplifier 13 then sinks or supplies excess current to the appropriate M2 transistor (instead excess current of being sunk by or supplied by the corresponding M1 transistor). The combination of amplifier 13 and the 2 pairs of parallel, bidirectional, diode-connected M1 and M2 transistors may be called a "current amplifier" or "current multiplier", and may be useful in various applications such as such as leakage current detection circuits or ohmmeter circuits for measuring the resistance of large resistors.

Figure 4B:
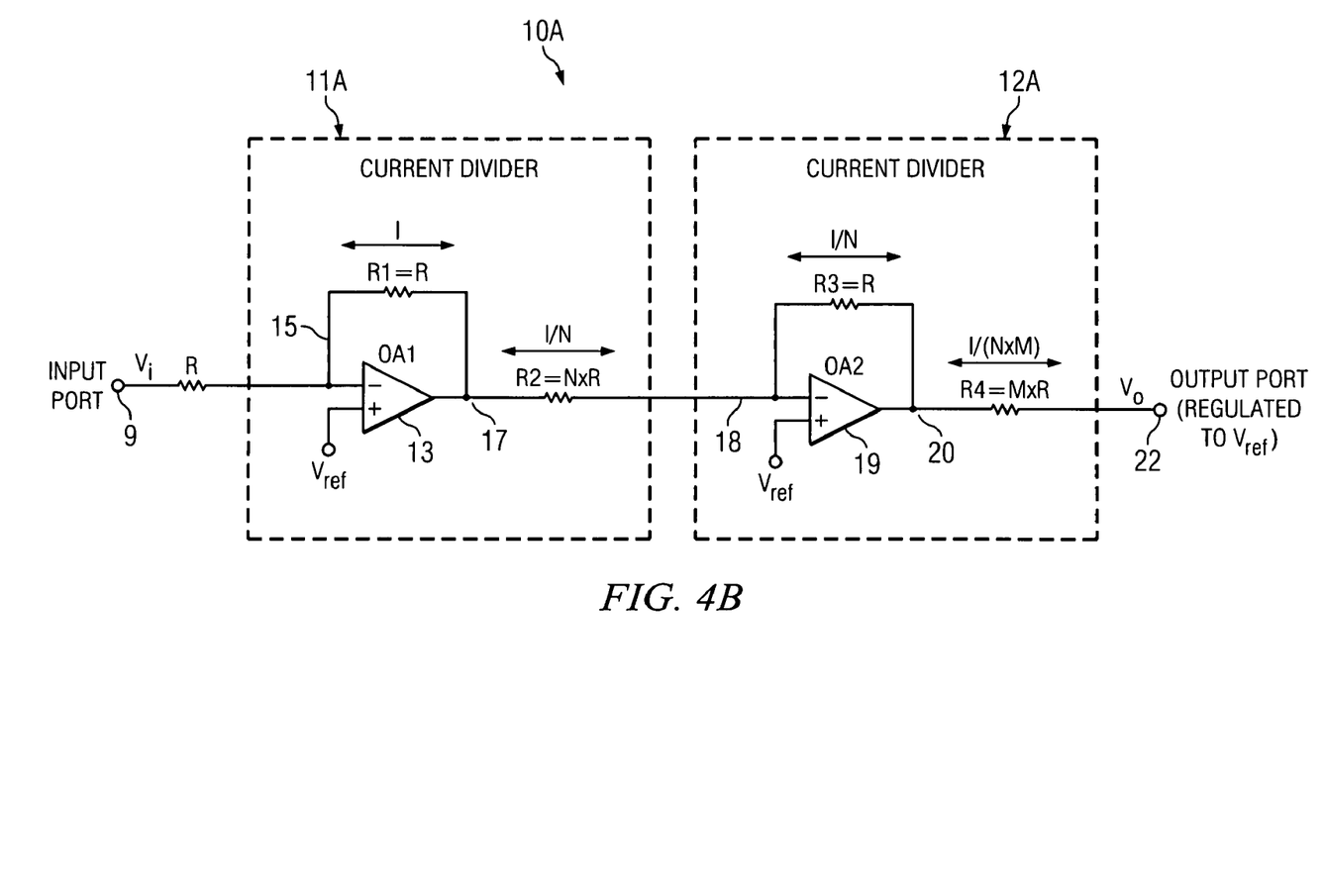
FIG. 4B is a schematic diagram of another embodiment of the present invention.

FIG. 4B is a schematic diagram of an active resistor circuit 10A which is similar to active resistor circuit 10 of FIG. 4A. However, in FIG. 4B the diode-connected transistors M1a and M1b of FIG. 4A are replaced by a resistor R1, diode-connected transistors M2a and M2b are replaced by a resistor R2, diode-connected transistors M3a and M3b are replaced by a resistor R3, and diode-connected transistors M4a and M4b are replaced by a resistor R4. As in FIG. 4A, active resistor circuit 10A of FIG. 4B includes a passive input resistor R coupled between an input conductor 15 of a first current divider circuit 11A and an input voltage $V_i$ on conductor 9. Current divider circuit 11A includes an operational amplifier 13 having its (−) input coupled by conductor 15 to one terminal of input resistor R and one terminal of resistor R1. The (+) input of amplifier 13 is coupled to reference voltage $V_{ref}$. The output of amplifier 13 is connected by conductor 17 to the other terminal of resistor R1. Conductor 17 also is connected to one terminal of resistor R2, the other terminal of which is connected by conductor 18 to an input of a second current divider circuit 12A. The ratio of the resistances R2 to R1 is equal to N, and the ratio of the resistances R3 to R4 is equal to M.

Current divider circuit 12A in FIG. 4B includes an operational amplifier 19 which has its (−) input connected by conductor 18 to the output of current divider circuit 11A and also to one terminal of resistor R3. The (+) input of operational amplifier 19 is connected to $V_{ref}$. The output of operational amplifier 19 is connected by conductor 20 to the other terminal of resistor R3 and one terminal of resistor R4, the other terminal of which is connected to output conductor 22, which is the output conductor of both current divider circuit 12A and of active resistor circuit 10A. An output voltage $V_o$ that is regulated to be equal to $V_{ref}$ is provided on conductor 22 (e.g., by an application circuit connected to conductor 22). As long as the voltage at output conductor 22 is regulated to equal $V_{ref}$, the current I/N in conductor 18 is further divided by the second current divider circuit 12A by the division ratio M. As a result, the output current of active resistor circuit 10A is equal to I/(N×M). Therefore, the effective resistance $R_{EFF}$ of active resistor circuit 10A between conductors 9 and 22 is $R_{EFF}$=N×M×R.

Thus, a simpler implementation of active resistor circuit 10 in FIG. 4A may be realized by using passive resistors instead of the MOSFETs shown in FIG. 4B. Precise matching of the passive resistors R1, R2, R3, and R4 in FIG. 4B is more easily achieved than matching of the diode-connected transistors in FIG. 4A, and only resistors R1/R2 and resistors R3/R4 need to be precisely ratioed/matched. Even very high values of the active resistance can be obtained without requiring a large amount of integrated circuit chip area because the very high values of effective resistance $R_{EFF}$ can be achieved mainly by suitably selecting the R1/R2 ratio N ratio and the R3/R4 ratio M. The implementation of FIG. 4B provides a more linear effective resistance $R_{EFF}$ than the implementation shown in FIG. 4A, and does not require substantially more chip area.

Note that in some cases it may be practical to provide, in a single active resistive circuit, a "first bidirectional circuit" as the parallel connection of diode-connected transistors M1a and M1b in the manner shown in FIG. 4A and to also provide a "second bidirectional circuit" as the single passive resistor R2 in the manner shown in FIG. 4B. Similarly, in some cases it may be practical to provide, in a single active resistive circuit, a "first bidirectional circuit" as the single passive resistor R1 in the manner shown in FIG. 4B and to also provide a "second bidirectional circuit" as the parallel connection of diode-connected transistors M2a and M2b in the manner shown in FIG. 4A.

Figure 5:
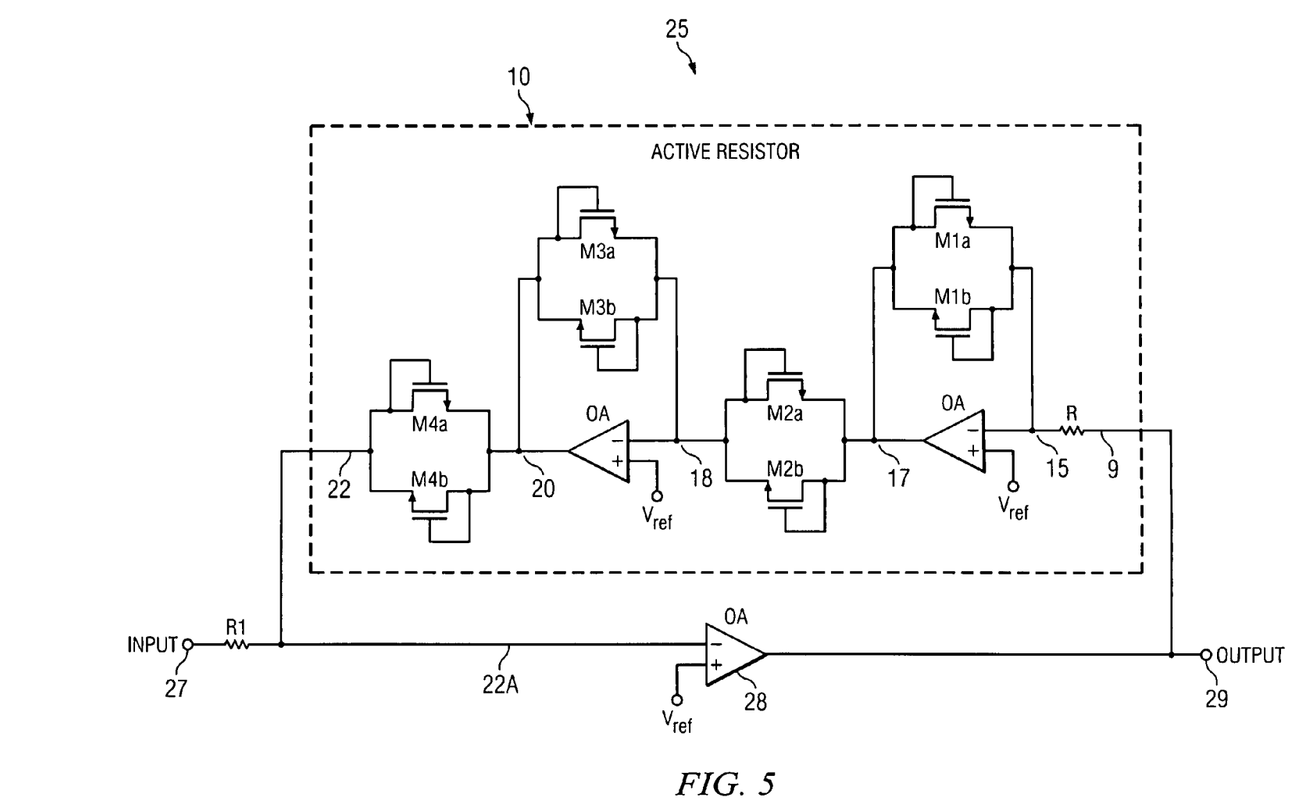
FIG. 5 is a schematic diagram of single-ended inverting amplifier implemented using the active resistor FIG. 4A.

FIG. 5 shows a schematic diagram of single-ended inverting amplifier 25 implemented using active resistor circuit 10 of FIG. 4A. In FIG. 5, an input voltage INPUT on conductor 27 is coupled to one terminal of an input resistor R1. The other terminal of resistor R1 is connected by output conductor 22 of active resistor 10 to the (−) input of a main operational amplifier 28. The (+) input of operational amplifier 28 is connected to $V_{ref}$. The output of operational amplifier 28 is connected by conductor 29 to terminal 9 of passive input resistor R of active resistor circuit 10, so active resistor circuit 10 functions as a feedback resistor of operational amplifier 28. The output signal OUTPUT produced by inverting amplifier 25 is produced on conductor 29. Operational amplifier 28 operates to regulate the voltage on conductor 22 to be equal to $V_{ref}$.

The gain of inverting amplifier 25 is equal to the resistance of the active resistor R divided by the resistance R1 of resistor R1. The operating voltage range and linearity of inverting amplifier 25 of FIG. 5 are significantly improved relative to the operating voltage range and linearity of any similar amplifier design that utilizes a prior art active resistor as a feedback resistor. Inverting amplifier 25 may be especially useful if a feedback resistance in the giga ohm range is needed.

Figure 6:
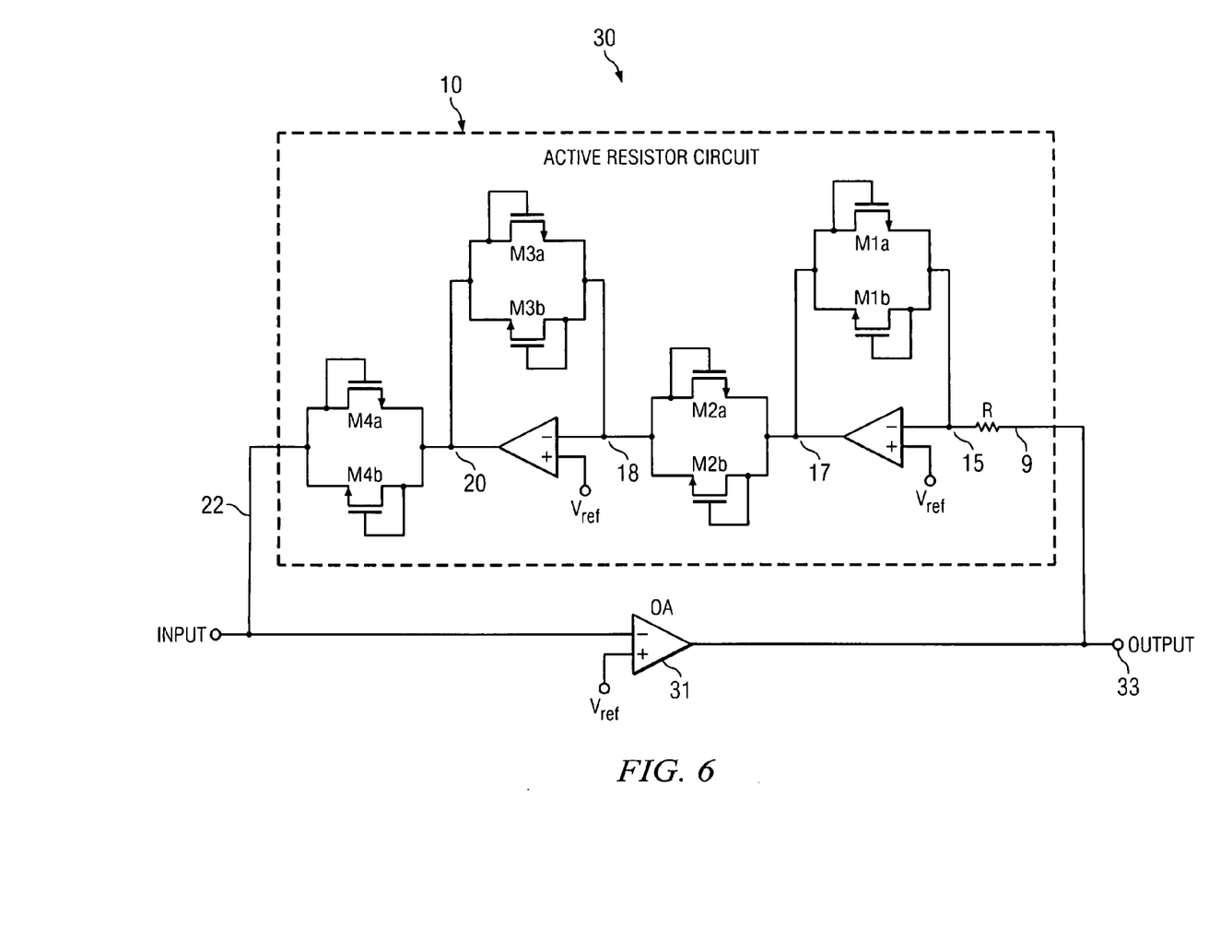
FIG. 6 is a schematic diagram of a single-ended transimpedance amplifier implemented using the active resistor FIG. 4A.

FIG. 6 shows a schematic diagram of single-ended transimpedance amplifier 30 implemented using active resistor circuit 10 of FIG. 4A. FIG. 6 is similar to FIG. 5 except that resistor R1 is omitted, and operational amplifier 28 of FIG. 5 appears as a transimpedance amplifier 31 in FIG. 6. The (−) input of transimpedance amplifier 31 is connected directly to conductor 22. Transimpedance amplifier 30 may be especially useful for chemical and biochemical sensor applications because extremely small currents (e.g., 100 picoamperes) may be sensed by designing active resistor circuit 10 to have very large values of resistance.

Figure 7:
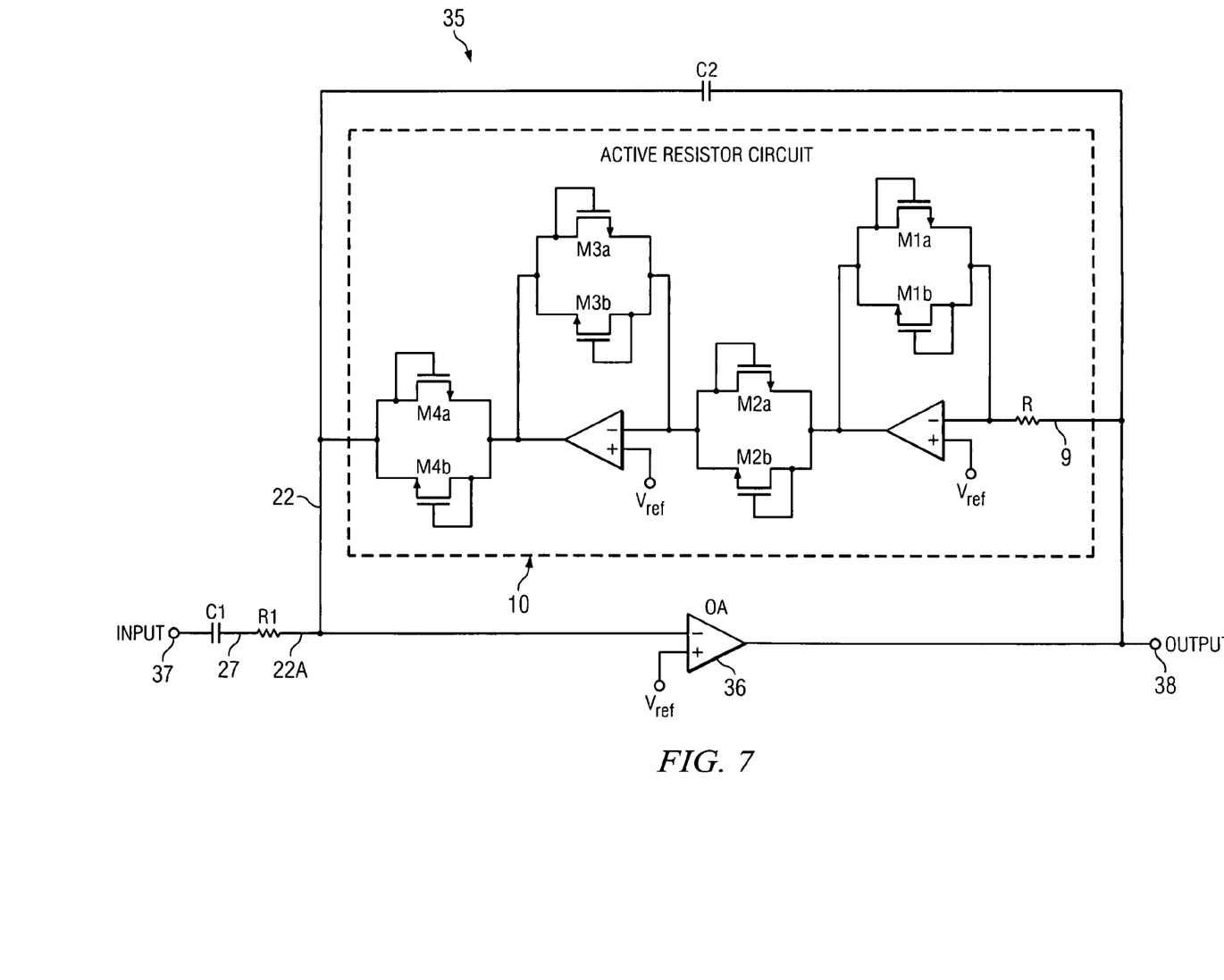
FIG. 7 is a schematic diagram of a single-ended band-pass filter implemented using the active resistor FIG. 4A.

FIG. 7 shows a schematic diagram of single-ended bandpass band-pass filter 35 implemented using active resistive circuit 10 of FIG. 4A. FIG. 7 is the same as FIG. 5, but with the further addition of input capacitor C1 coupled between input conductor 37 and terminal 27 of input resistor R1, and with the addition of capacitor C2 coupled in parallel with active resistor circuit 10.

Figure 8:
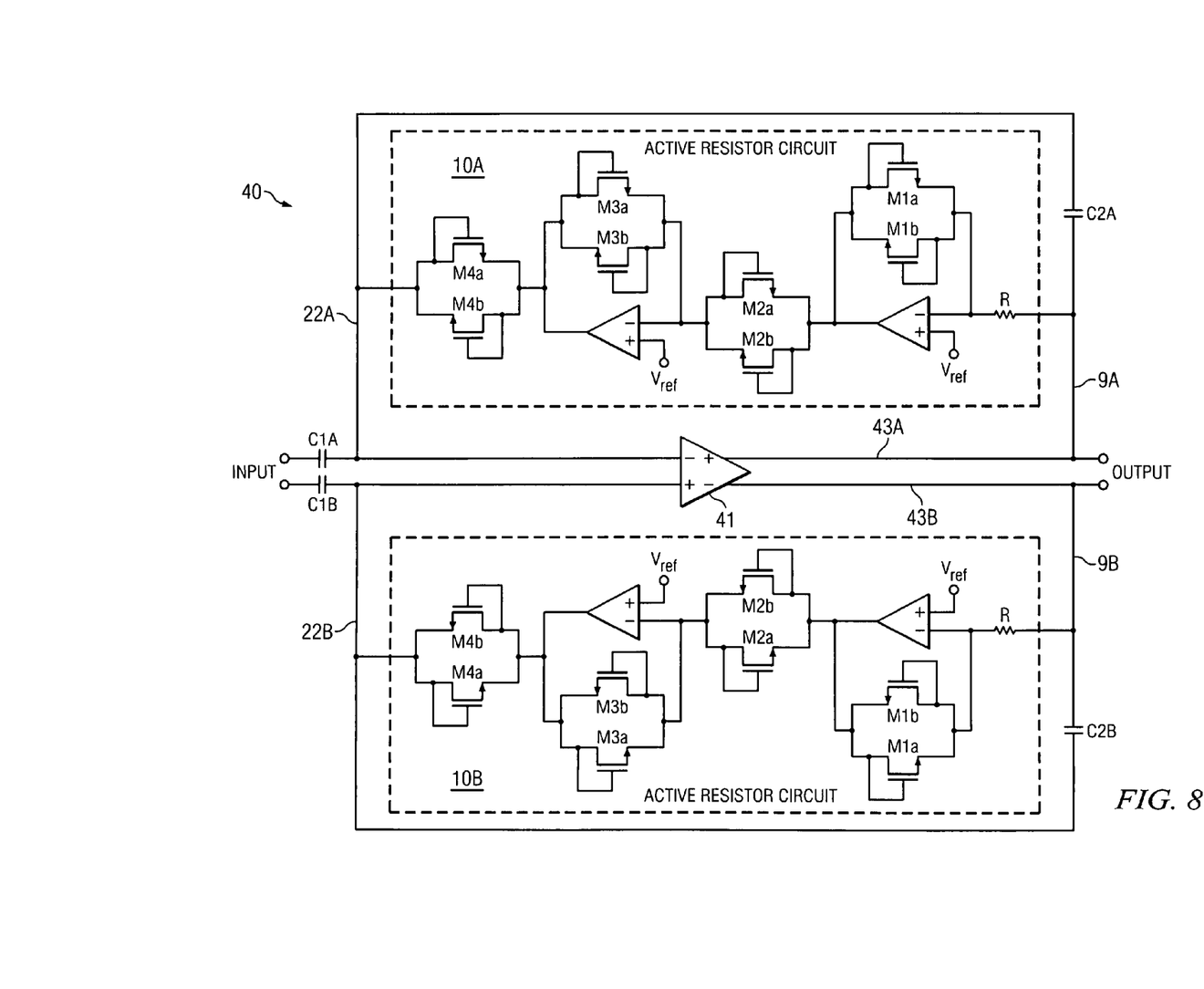
FIG. 8 is a schematic diagram of a fully-differential charge sensitive amplifier implemented using the active resistor FIG. 4A.

FIG. 8 shows a schematic diagram of a fully differential charge sensitive amplifier or filter 40 implemented using the active resistor 10 of FIG. 4A. (Whether the circuit is referred to as an amplifier or a filter may depend on the values of capacitors C1A,B and C2A,B, and also on whether capacitors C1A and C1B are sensor capacitances (in which case it is a charge sensitive amplifier) or fixed on-chip capacitors (which case circuit 40 is a high pass filter)). The charge sensitive amplifier of FIG. 8 is a fully differential implementation.

By way of definition, the term "active resistive circuit" as used herein is intended to encompass any circuit containing an active resistor circuit generally of the kind shown in FIGS. 4A and 4B.

Figure 9A:
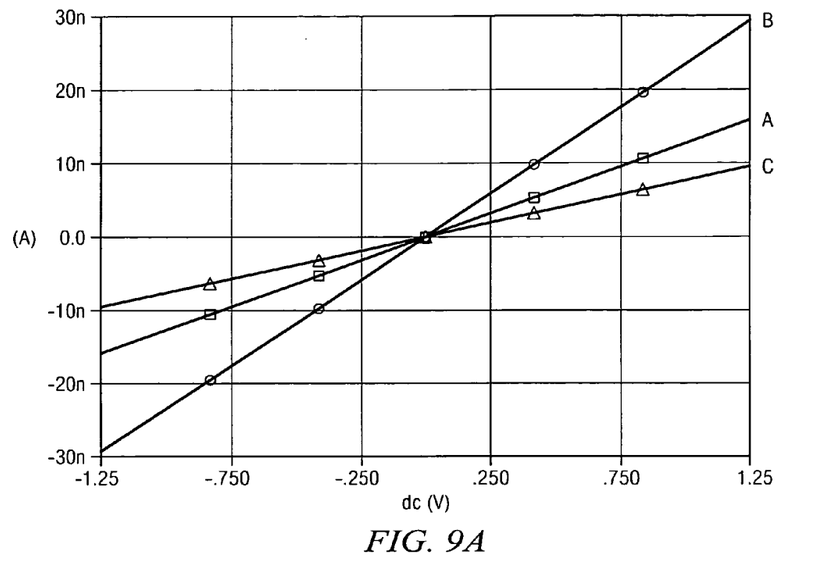
FIG. 9A shows DC transfer characteristics of the active resistive circuit of FIG. 4A for fabrication process parameter and temperature extremes.

FIG. 9A shows DC transfer characteristics of the active resistive circuit of FIG. 4A for fabrication process parameter and temperature extremes. Curve A is a nominal transfer characteristic of active resistor 10 of FIG. 4A at a temperature of 27° Centigrade. Curve B is the transfer characteristic for the same active resistor 10 at a temperature of 160° Centigrade, and Curve C is the transfer characteristic for the same active resistor 10 at a temperature of −50° Centigrade. The effective resistance of active resistor 10 is dependent on the wafer fabrication process and operating temperature variation of passive resistor R thereof. However, the division factors M and N are not affected by the fabrication process variation and the temperature, because the diode-connected transistors are affected essentially the same, as long as the transistors are matched.

Note that the DC transfer characteristics shown in FIG. 9A are also applicable to the active resistor circuit 10A of FIG. 4B.

Figure 9B:
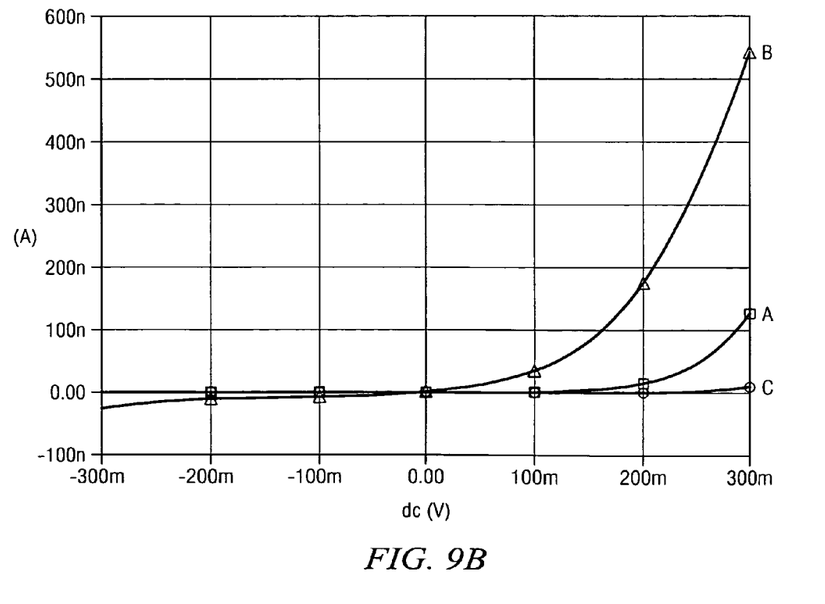
FIG. 9B shows DC transfer characteristics of a conventional pseudo-resistor for fabrication process parameter and temperature extremes.

FIG. 9B shows DC transfer characteristics of a conventional pseudo-resistor circuit for fabrication process parameter and temperature extremes. Curve A is a nominal transfer characteristic of the conventional pseudo-resistor circuit at a temperature of 27° Centigrade. Curve B is the transfer characteristic for the same conventional pseudo-resistor circuit at a temperature of 160° Centigrade, and Curve C is the transfer characteristic for the same conventional pseudo-resistor circuit at a temperature of −50° Centigrade. FIG. 9B shows that the effective resistance of the pseudo-resistor is highly, and of course undesirably, dependent on the temperature, voltage across the device and process parameters such as doping, carrier mobility, etc.

It will be clearly seen in FIG. 9A that active resistor 10 of FIG. 4A is quite linear and symmetrically bilateral in the entire supply voltage range of ±1.25 V. In contrast, the prior art pseudo-resistors are very non-linear and not symmetrically bilateral even in a much smaller voltage range of ±0.3 V as shown in FIG. 9B.

It should be appreciated that each of the circuits of FIGS. 5-8 can be readily implemented either as a single-ended circuit or a fully differential circuit. The examples of FIGS. 5-7 show how single-ended implementations may be provided, and the example of FIG. 8 shows how fully differential implementations may be provided.

The described embodiments of the active resistive circuits of the invention require relatively little silicon area to achieve very high resistance with very good linearity and large voltage swing capability. The proposed active resistive circuit structures may be very useful in various amplifier and filter circuits to obtain high gain and very low-frequency poles or DC biasing paths.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention.

What is claimed is:

1. Active resistive circuitry comprising:
    a first current divider circuit having an input coupled to a first signal, the first current divider circuit including
    (a) a first amplifier having a first input coupled to the first signal;
    (b) a symmetrically bilateral first bidirectional circuit coupled between the first input of the first amplifier and an output of the first amplifier, and functioning as a feedback circuit of the first amplifier; and
    (c) a symmetrically bilateral second bidirectional circuit coupled between the output of the first amplifier and an output of the first current divider circuit.

2. The active resistor circuitry of claim 1 including a passive resistor having a first terminal coupled to the first signal and a second terminal coupled to the first input of the first amplifier.

3. The active resistive circuitry of claim 1 wherein the first bidirectional circuit includes a first transistor having a source coupled to the first input of the first amplifier and a gate and drain coupled to the output of the first amplifier, wherein the first bidirectional circuit also includes a second transistor having a source coupled to the output of the first amplifier and a gate and drain coupled to the input of the first amplifier, wherein the second bidirectional circuit includes a third transistor having a source coupled to the output of the first amplifier and a gate and drain coupled to the first input of the first amplifier, and wherein the second bidirectional circuit also includes a fourth transistor having a source coupled to the output of the first current divider circuit and a gate and drain coupled to the output of the first amplifier.

4. The active resistive circuitry of claim 1 wherein the first bidirectional circuit includes a first resistor having one terminal coupled to the first input of the first amplifier and another terminal coupled to the output of the first amplifier, and wherein the second bidirectional circuit includes a second resistor having one terminal coupled to the output of the first amplifier and another terminal coupled to the first input of the first amplifier.

5. The active resistive circuitry of claim 1 further including a second current divider circuit having an input coupled to the output of the first current divider circuit, the second current divider circuit including
1) a second amplifier having a first input coupled to the output of the first current divider circuit,
2) a third bidirectional circuit coupled between the first input of the second amplifier and an output of the second amplifier and functioning as a feedback circuit of the second amplifier, and
3) a fourth bidirectional circuit coupled between the output of the second amplifier and an output of the second current divider circuit.

6. The active resistive circuitry of claim 2 further including a second current divider circuit having an input coupled to the output of the first current divider circuit, the second current divider circuit including
1) a second amplifier having a first input coupled to the output of the first current divider circuit,
2) a third bidirectional circuit coupled between the first input of the second amplifier and an output of the second amplifier and functioning as a feedback circuit of the second amplifier, and
3) a fourth bidirectional circuit coupled between the output of the second amplifier and an output of the second current divider circuit.

7. The active resistive circuitry of claim 5 wherein the first bidirectional circuit includes a first transistor having a source coupled to the first input of the first amplifier and a gate and drain coupled to the output of the first amplifier, the first bidirectional circuit also including a second transistor having a source coupled to the output of the first amplifier and a gate and drain coupled to the first input of the first amplifier,
wherein the second bidirectional circuit includes a third transistor having a source coupled to the output of the first amplifier and a gate and drain coupled to the input of the second current divider circuit, the second bidirectional circuit also including a fourth transistor having a source coupled to the input of the second current divider circuit and a gate and drain coupled to the output of the first amplifier,
wherein the third bidirectional circuit includes a fifth transistor having a source coupled to the first input of the second amplifier and a gate and drain coupled to the first input of the second amplifier, the third bidirectional circuit also including a sixth transistor having a source coupled to the output of the second amplifier and a gate and drain coupled to the first input of the second amplifier, and
wherein the fourth bidirectional circuit includes a seventh transistor having a source coupled to the output of the second amplifier and a gate and drain coupled to the output of the second current divider circuit, the fourth bidirectional circuit also including an eighth transistor having a source coupled to the output of the second current divider circuit and a gate and drain coupled to the output of the second amplifier.

8. The active resistive circuitry of claim 5 wherein the first bidirectional circuit includes a first resistor having one terminal coupled to the first input of the first amplifier and another terminal coupled to the output of the first amplifier, and wherein the second bidirectional circuit includes a second resistor having one terminal coupled to the output of the first amplifier and another terminal coupled to the first input of the first amplifier, and wherein the third bidirectional circuit includes a third resistor having one terminal coupled to the first input of the second amplifier and another terminal coupled to the output of the second amplifier, and wherein the fourth bidirectional circuit includes a fourth resistor having one terminal coupled to the output of the second amplifier and another terminal coupled to the output of the second current divider circuit.

9. The active resistive circuitry of claim 7 wherein a channel-width-to-channel-length ratio of the first transistor divided by a channel-width-to-channel-length ratio of the third transistor is substantially greater than a channel-width-to-channel-length ratio of the fifth transistor divided by a channel-width-to-channel-length ratio of the seventh transistor.

10. The active resistive circuitry of claim 9 wherein a channel-width-to-channel-length ratio of the second transistor divided by a channel-width-to-channel-length ratio of the fourth transistor is substantially greater than a channel-width-to-channel-length ratio of the sixth transistor divided by a channel-width-to-channel-length ratio of the eighth transistor.

11. The active resistive circuitry of claim 10 wherein the transistors are N-channel transistors.

12. The active resistive circuitry of claim 8 wherein a resistance of the first resistor divided by a resistance of the second transistor is substantially greater than a resistance of the third resistor divided by a resistance of the fourth resistor.

13. The active resistive circuitry of claim 6 including an inverting amplifier which includes:
1) a main amplifier;
2) an input resistor having a first terminal coupled to receive an input signal;
3) the active resistive circuit including the first amplifier, and the first and second current divider circuits, wherein the output of the second current divider circuit is coupled to a second terminal of the input resistor and an input of the main amplifier, and wherein an output of the main amplifier is coupled to the first terminal of the passive resistor.

14. The active resistive circuitry of claim 6 including a transimpedance amplifier which includes:
1) a main amplifier having an input coupled to receive an input signal; and
2) the active resistive circuit including the first amplifier, and the first and second current divider circuits, wherein the output of the second current divider circuit is coupled to the input of the main amplifier, and wherein an output of the main amplifier is coupled to the first terminal of the passive resistor.

15. The active resistive circuitry of claim 6 including a band-pass filter which includes:
1) a main amplifier;
2) an input resistor having a first terminal coupled to a first terminal of a input capacitor, the input capacitor having a second terminal coupled to receive an input signal;
3) the active resistive circuit including the first amplifier, and the first and second current divider circuits, wherein the output of the second current divider circuit is coupled to a second terminal of the input resistor and an input of the main amplifier, and wherein an output of the main amplifier is coupled to the first terminal of the passive resistor; and
4) a feedback capacitor coupled in parallel with the active resistive circuit.

16. The active resistive circuitry of claim 6 including a charge sensitive amplifier which includes:
1) a main amplifier;
2) an input capacitor having a first terminal coupled to receive an input signal;

3) the active resistive circuit including the first amplifier, and the first and second current divider circuits, wherein the output of the second current divider circuit is coupled to a second terminal of the input capacitor and an input of the main amplifier, and wherein an output of the main amplifier is coupled to the first terminal of the passive resistor, and 4) a feedback capacitor coupled in parallel with the active resistive circuit.

17. The active resistive circuitry of claim 16 wherein each of the first and second amplifiers has a second input coupled to a reference voltage, and wherein the output of the second current divider circuit is regulated to the reference voltage.

18. A method for providing active resistor circuitry, comprising:
(a) coupling a first signal to an input of a first amplifier;
(b) coupling a symmetrically bilateral first bidirectional circuit of a first current divider circuit between the input of the first amplifier and an output of the first amplifier; and
(c) coupling a symmetrically bilateral second bidirectional circuit of the first current divider circuit between the output of the first amplifier and an output of the first current divider circuit.

19. The method of claim 18 including coupling a first terminal of a passive resistor to a first signal and coupling a second terminal of the passive resistor to the input of the first amplifier.

20. The method of claim 18 wherein the first bidirectional circuit includes a first transistor and wherein the second bidirectional circuit includes a second transistor, the method including coupling a source of the first transistor to the input of the first amplifier and coupling a gate and drain of the first transistor to the output of the first amplifier, and coupling a gate and drain of the second transistor to the input of the first amplifier and coupling a source of the second transistor to the output of the first amplifier.

21. The method of claim 18 wherein the first bidirectional circuit includes a first resistor and the second bidirectional circuit includes a second resistor, the method including coupling one terminal of the first resistor to the input of the first amplifier and coupling another terminal of the first resistor to the output of the first amplifier, the method also including coupling one terminal of the second resistor to the output of the first amplifier and coupling another terminal of the second resistor to the output of the first current divider circuit.

22. The method of claim 18 including providing a second current divider circuit having an input coupled to the output of the first current divider circuit, the second current divider circuit including a second amplifier having an input coupled to the output of the first current divider circuit, a third bidirectional circuit coupled between the input of the second amplifier and an output of the second amplifier and functioning as a feedback circuit of the second amplifier, and a fourth bidirectional circuit coupled between the output of the second amplifier and an output of the second current divider circuit.

23. The method of claim 21 including providing a channel-width-to-channel-length ratio of the first transistor divided by a channel-width-to-channel-length ratio of the third transistor which is substantially greater than a channel-width-to-channel-length ratio of the fifth transistor divided by a channel-width-to-channel-length ratio of the seventh transistor.

24. A circuit for providing an active resistance, comprising:
(a) means for coupling a first signal to an input of a first amplifier;
(b) symmetrically bilateral first bidirectional means of a first current divider circuit coupled between the input of the first amplifier and an output of the first amplifier; and
(c) symmetrically bilateral second bidirectional means of the first current divider circuit coupled between the output of the first amplifier and an output of the first current divider circuit.

* * * * *